(12) United States Patent
Lao et al.

(10) Patent No.: US 11,637,139 B2
(45) Date of Patent: Apr. 25, 2023

(54) SEMICONDUCTOR DEVICE INCLUDING LIGHT-COLLIMATING LAYER AND BIOMETRIC DEVICE USING THE SAME

(71) Applicant: Vanguard International Semiconductor Corporation, Hsinchu (TW)

(72) Inventors: Chung-Ren Lao, Taichung (TW); Chih-Cherng Liao, Jhudong Township, Hsinchu County (TW); Shih-Hao Liu, Taoyuan (TW); Wu-Hsi Lu, New Taipei (TW); Ming-Cheng Lo, New Taipei (TW); Wei-Lun Chung, Changhua County (TW); Chih-Wei Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/719,918

(22) Filed: Apr. 13, 2022

(65) Prior Publication Data
US 2022/0238584 A1    Jul. 28, 2022

Related U.S. Application Data

(62) Division of application No. 16/361,853, filed on Mar. 22, 2019, now Pat. No. 11,335,717.

(51) Int. Cl.
*H01L 27/146* (2006.01)
*G02B 27/30* (2006.01)
*H01L 31/173* (2006.01)

(52) U.S. Cl.
CPC ........ *H01L 27/14623* (2013.01); *G02B 27/30* (2013.01); *H01L 27/14625* (2013.01);
(Continued)

(58) Field of Classification Search
CPC ........ H01L 27/14623; H01L 27/14625; H01L 27/14678; H01L 27/14685; G02B 27/30
See application file for complete search history.

(56) References Cited

U.S. PATENT DOCUMENTS

| 2010/0007975 A1 | 1/2010 | Tsao et al. |
| 2017/0038669 A1 | 2/2017 | Bierhuizen et al. |

(Continued)

FOREIGN PATENT DOCUMENTS

| CN | 103472941 A | 12/2013 |
| CN | 206657364 U | 11/2017 |

(Continued)

OTHER PUBLICATIONS

Backlight. (2018) Wikipedia <https://web.archive.org/web/20180511114351/https://en.wikipedia.org/wiki/Backlight> (Year: 2018).*

(Continued)

*Primary Examiner* — Robert G Bachner
*Assistant Examiner* — Molly K Reida
(74) *Attorney, Agent, or Firm* — Birch, Stewart, Kolasch & Birch, LLP

(57) ABSTRACT

A semiconductor device is provided. The semiconductor device includes a substrate and a light-collimating layer. The substrate has a plurality of pixels. The light-collimating layer is disposed on the substrate, and the light-collimating layer includes a transparent material layer, a first light-shielding layer, a second light-shielding layer and a plurality of transparent pillars. The transparent material layer covers the pixels. The first light-shielding layer is disposed on the substrate and the first light-shielding layer has a plurality of holes corresponding to the pixels. The second light-shield- (Continued)

ing layer is disposed on the first light-shielding layer. The transparent pillars are disposed in the second light-shielding layer.

15 Claims, 12 Drawing Sheets

(52) U.S. Cl.
CPC .. *H01L 27/14678* (2013.01); *H01L 27/14685* (2013.01); *H01L 27/14687* (2013.01); *H01L 27/14621* (2013.01); *H01L 31/173* (2013.01)

(56) References Cited

U.S. PATENT DOCUMENTS

| | | | |
|---|---|---|---|
| 2017/0220844 A1 | 8/2017 | Jones et al. | |
| 2018/0120149 A1* | 5/2018 | Chung | G01S 17/04 |
| 2018/0233531 A1 | 8/2018 | Huang et al. | |
| 2018/0270403 A1 | 9/2018 | Chung | |
| 2019/0050621 A1 | 2/2019 | Xu et al. | |
| 2019/0095674 A1 | 3/2019 | Ko et al. | |
| 2020/0251506 A1 | 8/2020 | Lee et al. | |
| 2020/0293738 A1* | 9/2020 | Zhang | G06V 40/1318 |

FOREIGN PATENT DOCUMENTS

| | | |
|---|---|---|
| CN | 207851850 U | 9/2018 |
| CN | 108629245 A | 10/2018 |
| CN | 108933152 A | 12/2018 |
| CN | 208314806 U | 1/2019 |
| TW | 201626438 A | 7/2016 |
| TW | M572986 U | 1/2019 |

OTHER PUBLICATIONS

Chinese Office Action and Search Report for Chinese Application No. 201910110932.4, dated Aug. 12, 2021.

Chinese Office Action and Search Report for Chinese Application No. 201910110932.4, dated Feb. 10, 2022.

Taiwanese Office Action and Search Report for Taiwanese Application No. 108102818, dated Aug. 21, 2019.

* cited by examiner

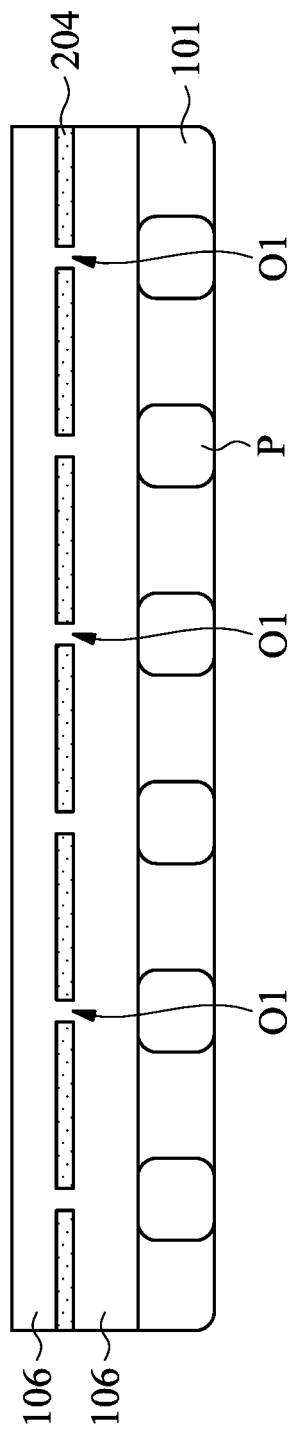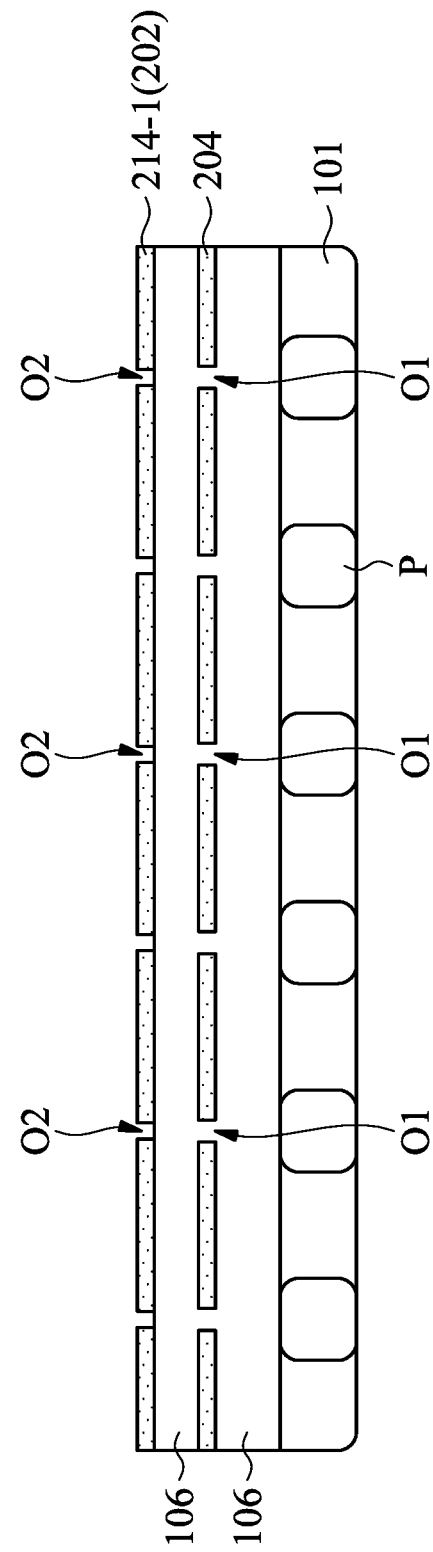

SEMICONDUCTOR DEVICE INCLUDING LIGHT-COLLIMATING LAYER AND BIOMETRIC DEVICE USING THE SAME

CROSS REFERENCE TO RELATED APPLICATIONS

This application is a Divisional of U.S. patent application Ser. No. 16/361,853, filed Mar. 22, 2019 and entitled "SEMICONDUCTOR DEVICE INCLUDING LIGHT-COLLIMATING LAYER".

BACKGROUND

Embodiments of the present disclosure relate to a semiconductor device, and in particular they relate to a semiconductor device that includes a light-collimating layer.

Semiconductor devices may be used in a variety of applications. For example, a semiconductor device may be used as at least one portion of a biometric device, such as a fingerprint identification device, a facial-recognition device, an iris scanner, etc. Such a biometric device may be composed of a large number of optical components, which may include a light collimator.

The light collimator may be used to collimate the light for reducing the energy lost due to light divergence. Therefore, a light collimator may be applied in a biometric device (e.g., a fingerprint identification device) to enhance the efficiency of identification.

However, existing light collimators have not been satisfactory in every respect.

SUMMARY

Some embodiments of the present disclosure relate to a semiconductor device. The semiconductor device includes a substrate and a light-collimating layer. The substrate has a plurality of pixels. The light-collimating layer is disposed on the substrate, and the light-collimating layer includes a transparent material layer, a first light-shielding layer, a second light-shielding layer and a plurality of transparent pillars. The transparent material layer covers the pixels. The first light-shielding layer is disposed on the substrate and the first light-shielding layer has a plurality of holes corresponding to the pixels. The second light-shielding layer is disposed on the first light-shielding layer. The transparent pillars are disposed in the second light-shielding layer.

Some embodiments of the present disclosure relate to a semiconductor device. The semiconductor device includes a substrate and a light-collimating layer. The substrate has a plurality of pixels. The light-collimating layer is disposed on the substrate, and the light-collimating layer includes a plurality of light-shielding layers and a transparent material layer. The light-shielding layers are disposed on the substrate, and each of the light-shielding layers has a plurality of holes corresponding to the pixels. The transparent material layer is disposed between the light-shielding layers and filling the holes.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G' is a top view illustrating the structure in the step of FIG. 1G.

FIGS. 3A, 3B, 3C, 3D, 3E and 3F are a series of cross-sectional views illustrating a method for forming the semiconductor device according to another embodiment of the present disclosure.

DETAILED DESCRIPTION

Figure 1A:
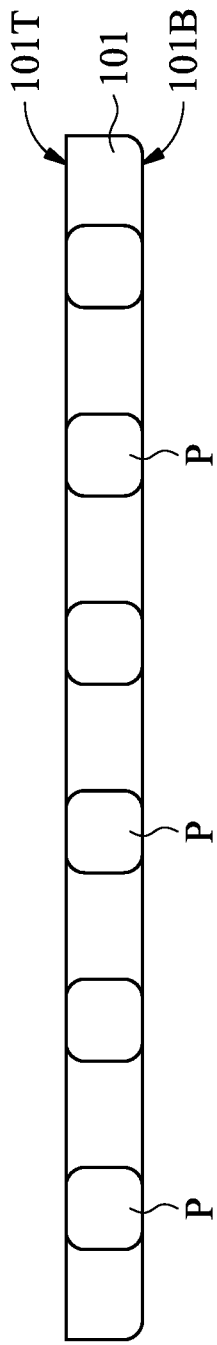
FIGS. 1A, 1B, 1C, 1D, 1E, 1F and 1G are a series of cross-sectional views illustrating a method for forming the semiconductor device according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 45 degrees or at other orientations) and the spatially relative descriptors used herein may likewise be interpreted accordingly.

In the present disclosure, the terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about" and "substantially", the stated value includes the meaning of "about" or "substantially".

It should be understood that, although the terms "first," "second," "third," etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

In some embodiments of the present disclosure, the light-collimating layer of the semiconductor device includes a plurality of light-shielding layers with holes having different cross-sectional areas. Since the light-shielding layers may be disposed in the light-collimating layer and the transparent material layer may be disposed correspondingly, each of the transparent pillars of the light-collimating layer may have a smaller aspect ratio. This may avoid or reduce the collapse of the transparent pillars and maintain great collimation performance of the light-collimating layer at the same time. The following description will be made with the embodiments shown in FIGS. 1A-1G'.

Figure 1B:
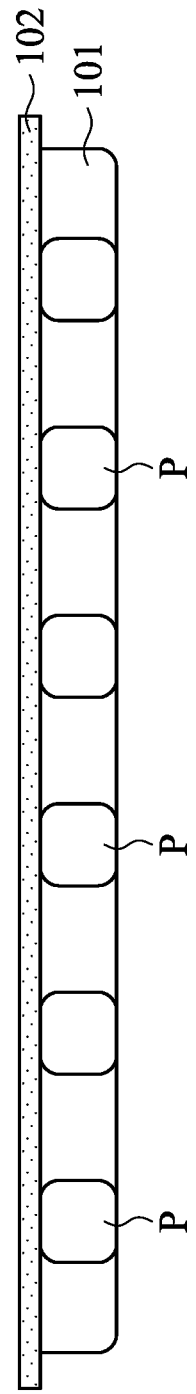
Figure 1C:
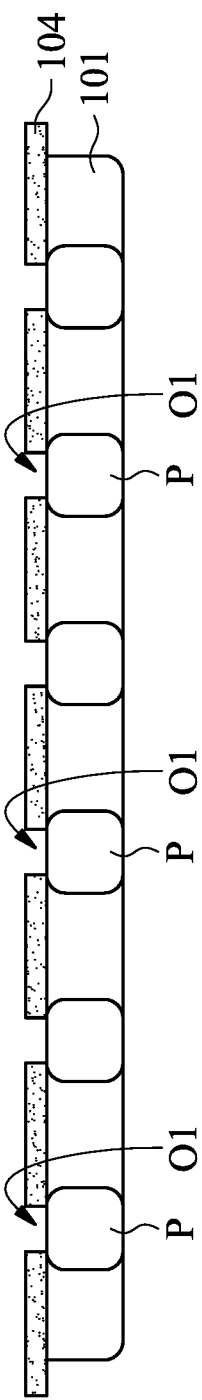
Figure 1D:
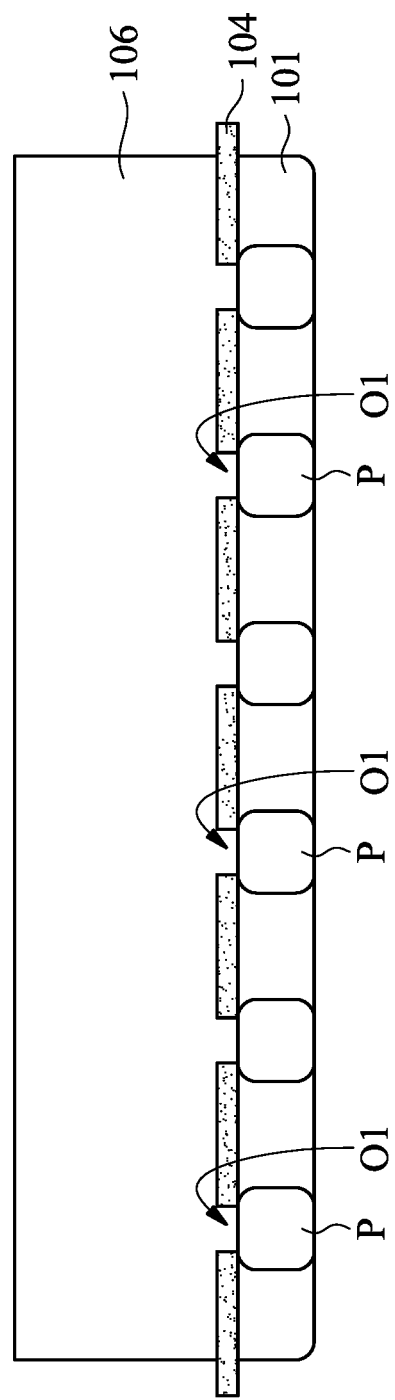
Figure 1E:
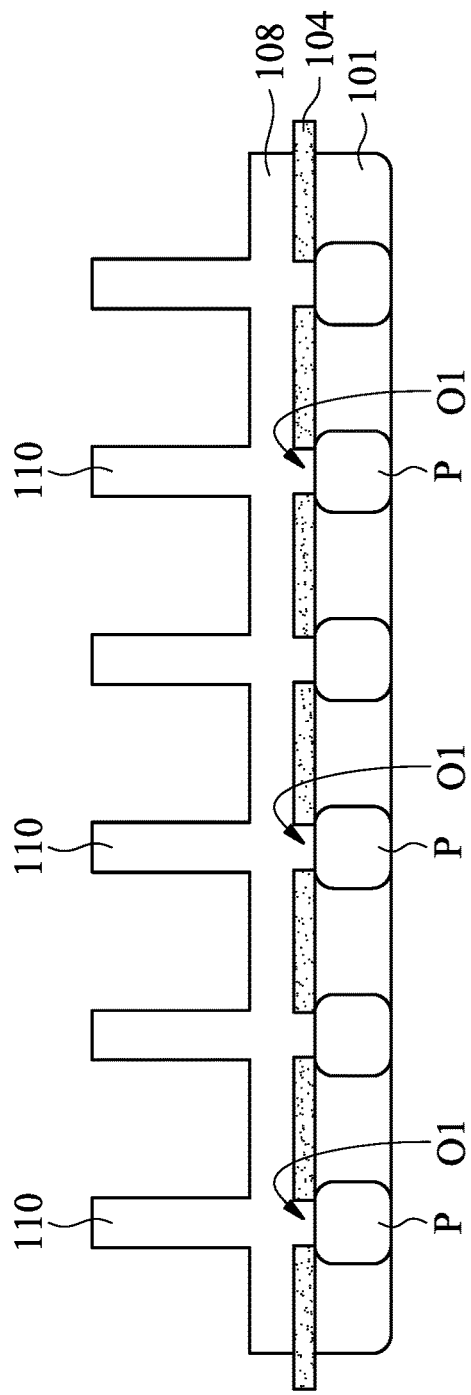
Figure 1F:
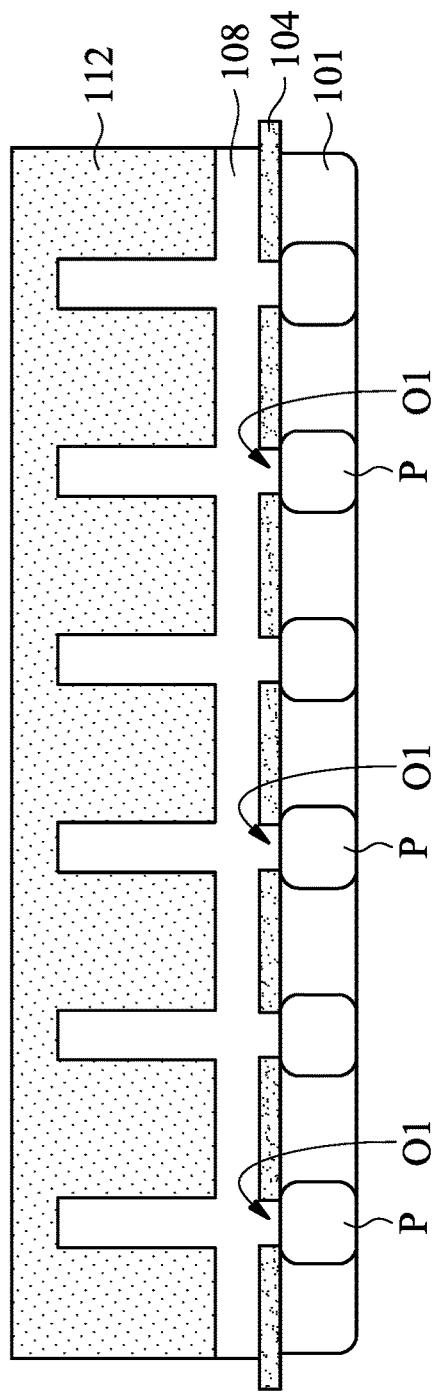
Figure 1G:
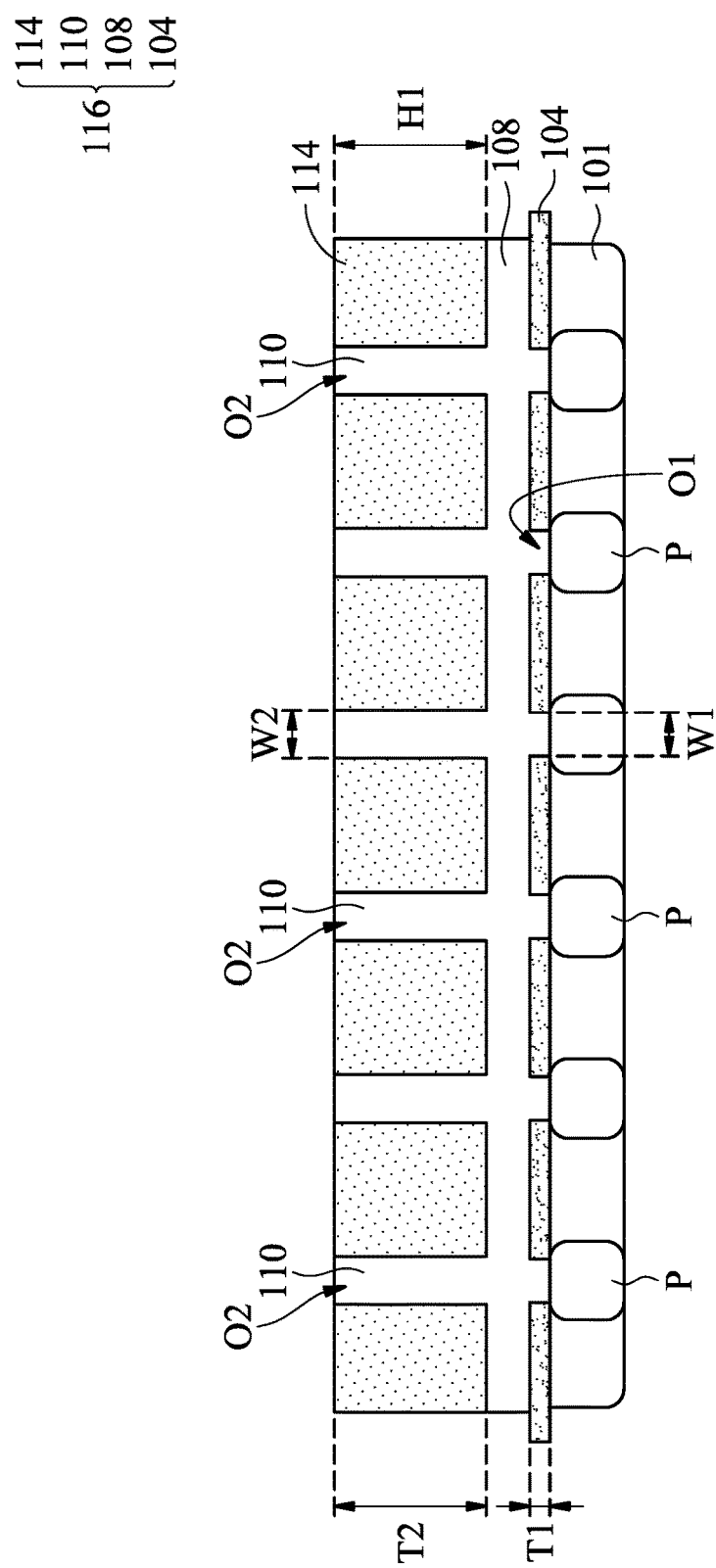
Figure 1G:
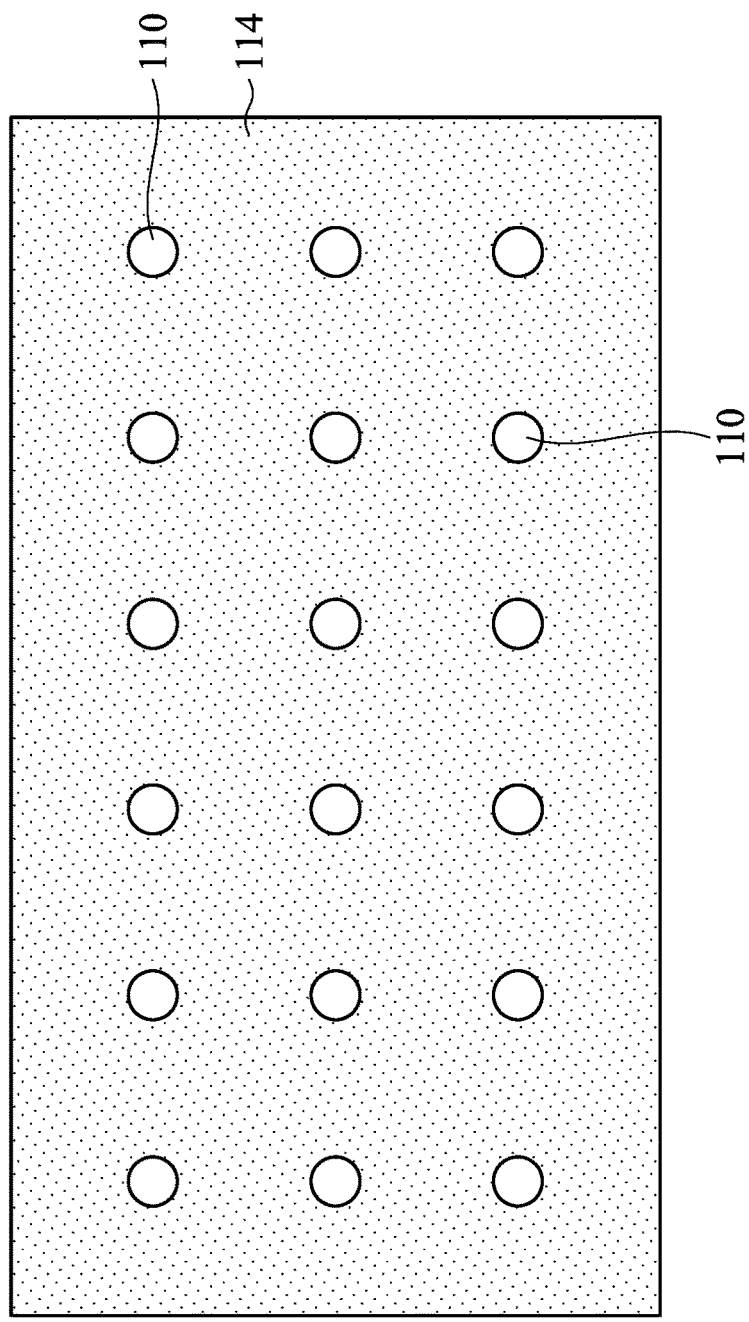

FIGS. 1A, 1B, 1C, 1D, 1E, 1F and 1G are a series of cross-sectional views illustrating a method for forming the semiconductor device 100 according to an embodiment of the present disclosure. FIG. 1G' is a top view illustrating the structure in the step of FIG. 1G.

First, according to some embodiments, a substrate 101 is provided as shown in FIG. 1A. The substrate 101 may have a top surface 101T and a bottom surface 101B opposite the top surface 101T.

In some embodiments, the substrate 101 may be made of an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof. In some embodiments, the substrate 101 may be a semiconductor-on-insulator (SOI) substrate. The semiconductor-on-insulator substrate may include a bottom substrate, a buried oxide layer disposed on the bottom substrate, and a semiconductor layer disposed on the buried oxide layer. In some embodiments, the substrate 101 may be a semiconductor wafer (e.g., a silicon wafer, or any other applicable semiconductor wafer).

In some embodiments, the substrate 101 may include various p-type doped regions and/or n-type doped regions formed by a process such as an ion implantation process and/or a diffusion process. For example, the doped regions may be configured to form a transistor, a photodiode, and/or a light-emitting diode, but the present disclosure is not limited thereto.

In some embodiments, the substrate 101 may include various isolation features to separate various device regions in the substrate 101. For example, the isolation features may include a shallow trench isolation (STI) feature, but the present disclosure is not limited thereto. The formation of a shallow trench isolation (STI) feature may include etching a trench in the substrate 101 and filling in the trench with insulating materials (e.g., silicon oxide, silicon nitride, or silicon oxynitride). The filled trench may have a multi-layer structure, such as a thermal oxide liner layer with silicon nitride filling the trench. A chemical mechanical polishing (CMP) process may be performed to polish back excessive insulating materials and planarize the top surface of the isolation features.

In some embodiments, the substrate 101 may include various conductive features (e.g., conductive lines or vias). For example, the conductive features may be made of aluminum (Al), copper (Cu), tungsten (W), an alloy thereof, any other applicable conductive material, or a combination thereof.

In the embodiment as shown in FIG. 1A, the substrate 101 may include a plurality of pixels P. In some embodiments, the pixels P of the substrate 101 may be arranged in an array, but the present disclosure is not limited thereto.

In some embodiments, each of the pixels P of the substrate 101 may include or correspond to at least one photodiode and/or other applicable elements, which may convert the received light signals into electric current signals.

Next, in some embodiments, a first material 102 is disposed on the top surface 101T of the substrate 101 as shown in FIG. 1B. In this embodiment, the first material 102 may include a metal, such as copper (Cu), silver (Ag), and so on, but the present disclosure is not limited thereto. In other embodiments, the first material 102 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black-)epoxy polymer, any other applicable material, or a combination thereof. In some embodiments, the first material 102 may include a light curing material, a thermal curing material, or a combination thereof.

Next, a patterning process may be performed to pattern the first material 102 and form a first light-shielding layer 104 as shown in FIG. 1C. The light-shielding layer 104 may be in direct contact with the top surface 101T of the substrate 101. In more detail, some portions of the first material 102 may be removed in the patterning process to form the first light-shielding layer 104 having a plurality of holes O1 corresponding to the pixels P. In some embodiments, the patterning process may include soft baking, mask aligning, exposure, post-exposure baking, developing, rinsing, drying, any other applicable process, or a combination thereof.

Next, a transparent material 106 is disposed on the top surface 101T of the substrate 101 as shown in FIG. 1D. For example, the transparent material 106 may include transparent photoresist, polyimide, epoxy resin, any other applicable material, or a combination thereof. In the subsequent processes, the transparent material 106 may be used to form the transparent material layer and the transparent pillar (e.g., the transparent material layer 108 and the transparent pillar 110 described later), which will be described in detail in the following description.

In some embodiments, the transparent material 106 may include a light curing material, a thermal curing material, or a combination thereof. For example, a spin-on coating process may be performed to coat the transparent material 106 between the first light-shielding layer 104 and the substrate 101, but the present disclosure is not limited thereto.

Next, a patterning process may be performed to pattern the transparent material 106 and form a transparent material layer 108 and a plurality of transparent pillars 110 as shown in FIG. 1E. In more detail, some portions of the transparent material 106 may be removed, and the transparent material 106 remained on the substrate 101 (and remained in the holes O1 corresponding to the pixels P) may become the transparent material layer 108 and the transparent pillars 110. Similarly, in some embodiments, the patterning process may include soft baking, mask aligning, exposure, post-exposure baking, developing, rinsing, drying, any other applicable process, or a combination thereof.

As shown in FIG. 1E, in this embodiment, the transparent material layer 108 covers the first light-shielding layer 104 and the pixels P and fills the holes O1 of the first light-shielding layer 104; the transparent pillars corresponds to the pixels P. In other words, the transparent material layer 108 may fully cover (or partially cover) the pixels P in the embodiment shown in FIG. 1E. In some embodiments, the transparent material layer 108 (and the first light-shielding layer 104) covering the pixels may reduce or avoid the pixels from being damage and/or contaminated during the manufacturing process. In some embodiments, the transparent pillars 110 may be arranged in an array, but the present disclosure is not limited thereto.

Next, in some embodiments, a second material 112 is disposed in the top surface of the transparent material layer 108 as shown in FIG. 1F. In some embodiments, the second material 112 may fill the openings between the transparent pillars 110 and cover the transparent pillars 110.

In this embodiment, the first material 102 is different from the second material 112. For example, the first material 102 may include a metal, while the second material 112 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black-)epoxy polymer, any other applicable material, or a combination thereof. In some embodiments, the second material 112 may include a light curing material, a thermal curing material, or a combination thereof, but the present disclosure is not limited thereto. In other embodiments, the first material 102 may be the same as the second material 112. That is, the first material 102 may include photoresist, ink, molding compound, solder mask, (black-)epoxy polymer, any other applicable material, or a combination thereof.

Next, a curing process may be performed to cure the second material 112 as shown in FIG. 1G. For example, the curing process may be a light curing process, a thermal curing process, or a combination thereof. Then, a planarization process may be performed to remove some portions of the second material 112, such that the top surfaces of the transparent pillars 110 may be exposed and the second light-shielding layer 114 may be formed. In some embodiments, some portions of the transparent pillars 110 (e.g., some portions of the top of the transparent pillars 110) may also be removed during the planarization process. For example, the planarization process may include a chemical mechanical polishing (CMP) process, a grinding process, an etching back process, any other applicable process, or a combination thereof.

In some embodiments, the top surface of the second light-shielding layer 114 and the top surfaces of the transparent pillars 110 may be aligned with each other after the planarization process. That is, the top surface of the second light-shielding layer 114 and the top surfaces of the transparent pillars 110 may be coplanar after the planarization process.

In some embodiments, the second light-shielding layer 114 may surround the transparent pillars 110 as shown in FIG. 1G and FIG. 1G'. That is, the transparent pillars 110 may be disposed in the second light-shielding layer 114 in the embodiment as shown in FIG. 1G and FIG. 1G'. In some embodiments, the top surface of each of the transparent pillars 110 may be round as shown in FIG. 1G', but the present disclosure is not limited thereto. In other embodiments, the top surface of each of the transparent pillars 110 may be oval, oblong, rectangular, hexagonal, irregular-shaped, any other applicable shape, or a combination thereof.

Moreover, since the transparent pillars 110 correspond to the pixels, the transparent pillars 110 also correspond to the holes O1 of the first light-shielding layer 104. In some embodiments, the width W2 of one of the transparent pillars 110 is larger than the width W1 of the corresponding one of the holes O1. For example, the width W2 of the transparent pillar 110 may be between 6 and 20 μm, and the width W1 of the hole O1 may be between 1 and 10 μm. Here, the width W2 of the transparent pillar 110 is defined as the largest width in the cross-sectional area of the transparent pillar 110, and the width W1 of the hole O1 is defined as the largest width in the cross-sectional area of the hole O1. For example, the cross-sectional area of the transparent pillar 110 is a circle, and the width W2 of the transparent pillar 110 is therefore the diameter of the circle; the cross-sectional area of hole O1 is a circle, and the width W1 of the hole O1 is therefore the diameter of the circle.

In some embodiments, the thicknesses of the light-shielding layers may be different from each other. For example, the thickness T1 of the first light-shielding layer 104 is smaller than the thickness T2 of the second light-shielding layer 114 in the embodiment as shown in FIG. 1G. For example, the thickness T1 of the first light-shielding layer 104 may be between 4 and 20 μm, and the thickness T2 of the second light-shielding layer 114 may be between 10 and 90 μm. But the present disclosure is not limited thereto.

In some embodiments, the transparent pillars 110, the first light-shielding layer 104, the second light-shielding layer 114 and the transparent material layer 108 may serve as the light-collimating layer 116 of the semiconductor device 100 as shown in FIG. 1G. Here, the spaces occupied by the transparent pillars 110 may be regarded as a plurality of holes O2 of the second light-shielding layer 114. The holes O2 correspond to the pixels P, and the cross-sectional area of each hole O1 of the first light-shielding layer 104 may be smaller than the cross-sectional area of each hole O2 of the second light-shielding layer 114.

The size of the hole O2 of the second light-shielding layer 114 and the size of the hole O1 of the first light-shielding layer 104 may be adjusted in accordance with the paths of the lights to avoid the lights in the semiconductor device 100 from crosstalk. Moreover, the transparent material layer 108 may be correspondingly disposed, such that each of the transparent pillars 110 of the light-collimating layer 116 may have a smaller aspect ratio (e.g., the ratio of the height H1 and the width W2 of one of the transparent pillars 110 (i.e., H1/W2) may be between 0.5 and 15). This may avoid or reduce the collapse of the transparent pillars 110 and maintain great collimation performance of the light-collimating layer 116 at the same time.

Figure 2:
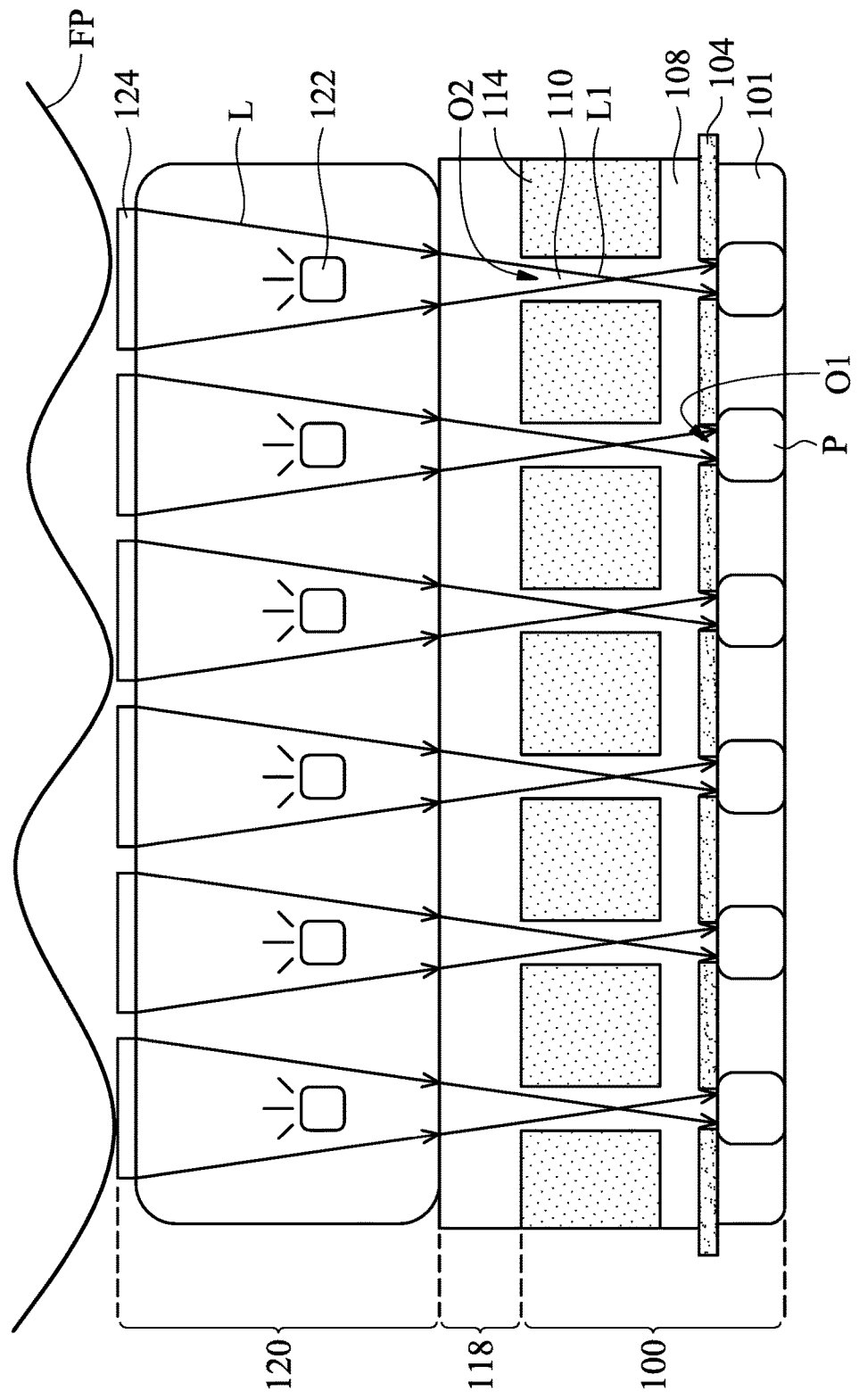
FIG. 2 is a schematic diagram illustrating the application of the semiconductor device of the embodiments according to the present disclosure to a biometric device.

FIG. 2 is a schematic diagram illustrating the application of the semiconductor device 100 of the embodiments according to the present disclosure to a biometric device 10. Here, the biometric device 10 may be a fingerprint identification device, for example.

In some embodiments, the biometric device 10 may include the semiconductor device 100, a color filter layer 118 and a light source layer 120 as shown in FIG. 2. The semiconductor device 100 may be formed according to the steps shown in FIGS. 1A-1G. Next, the color filter layer 118 may be disposed on the semiconductor device 100. The color filter layer 118 may be made of a polymer material or another suitable material. The color filter layer 118 is configured to limit the passage of light, such that the light with a specific wavelength may pass through the color filter layer 118, and the light with other wavelengths may be isolated.

Next, the light source layer 120 may be disposed on the color filter layer 118. In some embodiments, light source layer 120 may include a plurality of light sources (e.g., light emitting diode, LED) 122. The light sources 122 may be arranged in an array, for example. Moreover, the light source layer 120 may further include a barrier layer, other suitable optical components, or a combination thereof (not shown). A cover plate (e.g., glass cover plate) 124 may be disposed on the top of the light source layer 120 to form a biometric device (e.g., fingerprint identification device). It should be noted that the light source layer 120 may include other elements which is not shown in FIG. 2. The present disclosure is not limited thereto.

For example, the lights emitting from the light sources 122 may be blocked by the biometric characteristics (e.g., fingerprints FP) from outside, and then different reflected lights L are generated and enter the color filter layer 118. The color filter layer 118 may limit the reflected lights L, such that the light L1 with the specific wavelength corresponding to the pixels P (e.g., including or corresponding to at least one photoelectric diode (PD) and/or other suitable components) may pass through the color filter layer 118, and the light with other wavelengths may be isolated. The light L1 passing through the color filter layer 118 then enter the transparent pillars 110 inside the second light-shielding layer 114. Since the second light-shielding layer 114 may be black (e.g., formed of black photoresist, black ink, black molding compound or black solder mask) and the size of the hole O2 of the second light-shielding layer 114 (or the width W2 of the transparent pillar 110) may be adjusted in accordance with the path of the light, it may avoid the lights L1 from crosstalk and enhance the collimation performance of the light-collimating layer 116. Next, the lights L1 passing through the transparent pillar 110 enter the transparent material layer 118, and then pass though the holes O1 of the first light-shielding layer 104 to enter the pixels P. Similarly, since the size of the hole O1 of the first light-shielding layer 104 may be adjusted in accordance with the path of the light, it may avoid the lights L1 from crosstalk and enhance the collimation performance of the light-collimating layer 116.

In some embodiments, using the metal (e.g., copper, silver) as the first material 102 for forming the first light-shielding layer 104 may effectively simplify the manufacturing process. Moreover, it may be known from the path of the lights L (of lights L1) that since the size of each hole (e.g., hole O1 and hole O2) of the plurality of light-shielding layers (e.g., the first light-shielding layer 104 and the second light-shielding layer 114) may be adjusted in accordance with the path of the lights, it may effectively limit the positions of the lights to avoid the lights from crosstalk.

Moreover, the transparent material layer 108 may be correspondingly disposed, such that each of the transparent pillars 110 of the light-collimating layer 116 may have a smaller aspect ratio. This may avoid or reduce the collapse of the transparent pillars 110 and maintain great collimation performance of the light-collimating layer 116 at the same time (i.e., the resolution of the pixels P may be more improved).

FIGS. 3A, 3B, 3C, 3D, 3E and 3F are a series of cross-sectional views illustrating a method for forming the semiconductor device 100' according to another embodiment of the present disclosure. Some differences between the semiconductor device 100' and the semiconductor device 100 include the position of the first light-shielding layer 204 and the structure of the second light-shielding layer 214-1. It will be described in detail in the following description.

Figure 3A:
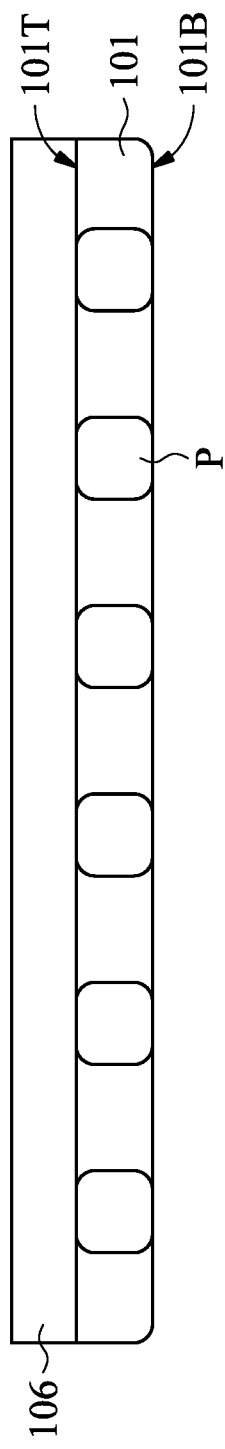

First, according to some embodiments, a substrate 101 is provided as shown in FIG. 3A. The substrate 101 may have a top surface 101T and a bottom surface 101B opposite the top surface 101T. The substrate 101 may include a plurality of pixels P. In some embodiments, the pixels P of the substrate 101 may be arranged in an array, but the present disclosure is not limited thereto. In some embodiments, each of the pixels P of the substrate 101 may include or correspond to at least one photodiode and/or other applicable elements, which may convert the received light signals into electric current signals.

Next, a transparent material 106 is disposed on the top surface 101T of the substrate 101, such that the transparent material 106 may fully cover (or partially cover) the pixels P. For example, the transparent material 106 may include transparent photoresist, polyimide, epoxy resin, any other applicable material, or a combination thereof. In the subsequent processes, the transparent material 106 may be used to form the transparent material layer and the transparent pillar (e.g., the transparent material layer 108 and the transparent pillar 210 described later), which will be described in detail in the following description.

In some embodiments, the transparent material 106 may include a light curing material, a thermal curing material, or a combination thereof. For example, a spin-on coating process may be performed to coat the transparent material 106 on the top surface 101T of the substrate 101, but the present disclosure is not limited thereto.

Figure 3B:
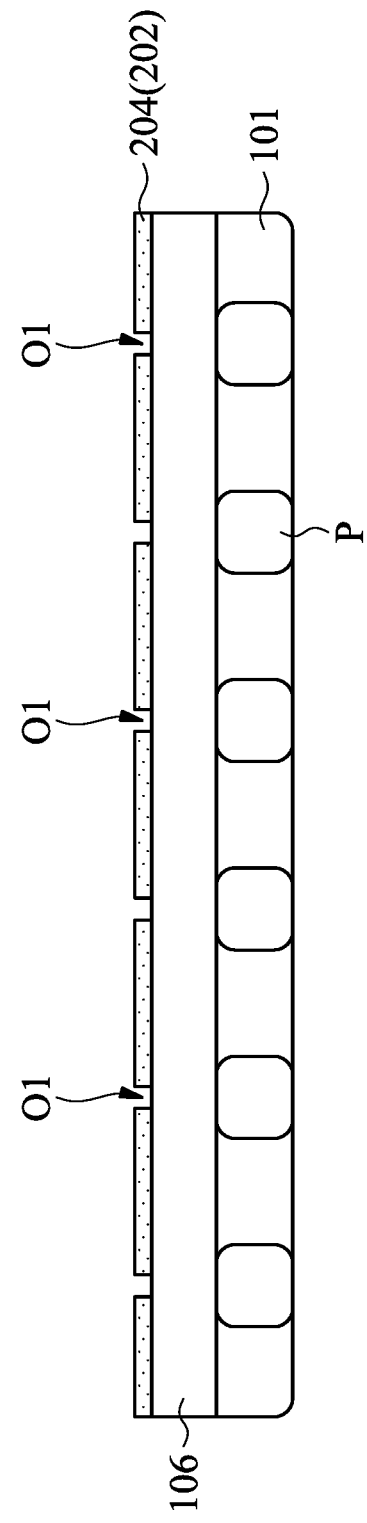

Next, in some embodiments, a light-shielding material 202 is disposed on the transparent material 106 as shown in FIG. 3B. In some embodiments, the light-shielding material 202 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), (black-)epoxy polymer, any other applicable material, or a combination thereof. In some embodiments, the light-shielding material 202 may include a light curing material, a thermal curing material, or a combination thereof, but the present disclosure is not limited thereto. In other embodiments, the light-shielding material 202 may also include a metal, such as copper, silver, and so on.

Next, a patterning process may be performed to pattern the light-shielding material 202 and form a first light-shielding layer 204 as shown in FIG. 3B. In more detail, some portions of the light-shielding material 202 may be removed in the patterning process to form the first light-shielding layer 204 having a plurality of holes O1 corresponding to the pixels P. In some embodiments, the patterning process may include soft baking, mask aligning, exposure, post-exposure baking, developing, rinsing, drying, any other applicable process, or a combination thereof.

Next, in some embodiments, the transparent material 106 is disposed on the first light-shielding layer 204 as shown in FIG. 3C, such that the transparent material 106 may fully cover (or partially cover) the first light-shielding layer 204 fill the holes O1 of the first light-shielding layer 204.

Next, in some embodiments, the light-shielding material 202 is disposed on the transparent material 106 again a patterning process may be performed to pattern the light-shielding material 202 and form a second light-shielding layer 214-1 as shown in FIG. 3D. In more detail, some portions of the light-shielding material 202 may be removed in the pattering process to form the second light-shielding layer 214-1 having a plurality of holes O2 corresponding to the pixels P. Similarly, the patterning process may include soft baking, mask aligning, exposure, post-exposure baking, developing, rinsing, drying, any other applicable process, or a combination thereof.

Figure 3E:
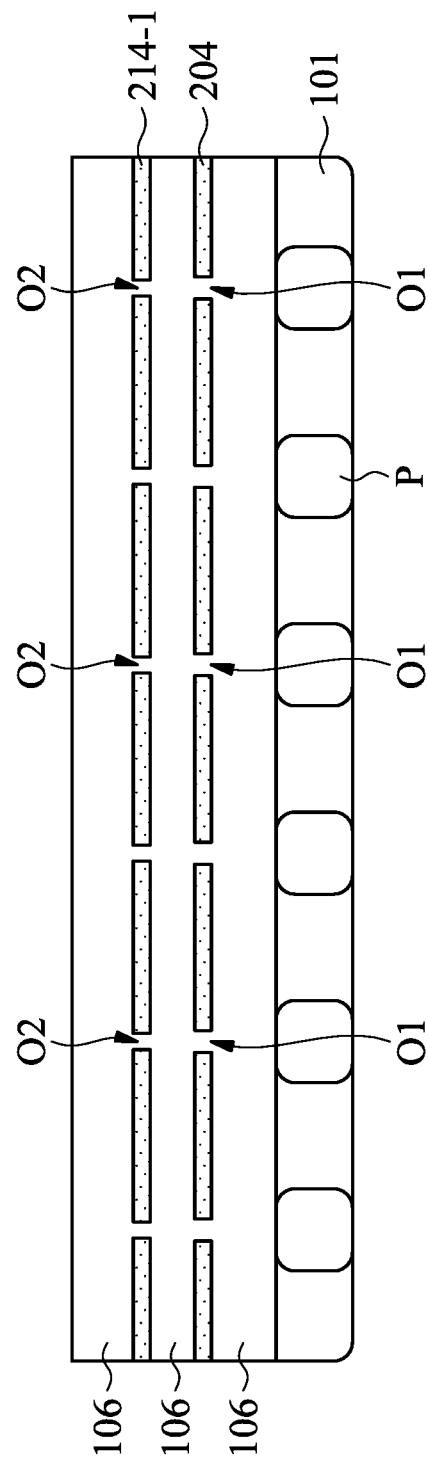

Next, in some embodiments, the transparent material 106 is disposed on the second light-shielding layer 214-1 as shown in FIG. 3E, such that the transparent material 106 may fully cover (or partially cover) the second light-shielding layer 214-1 fill the holes O2 of the second light-shielding layer 214-1.

Figure 3F:
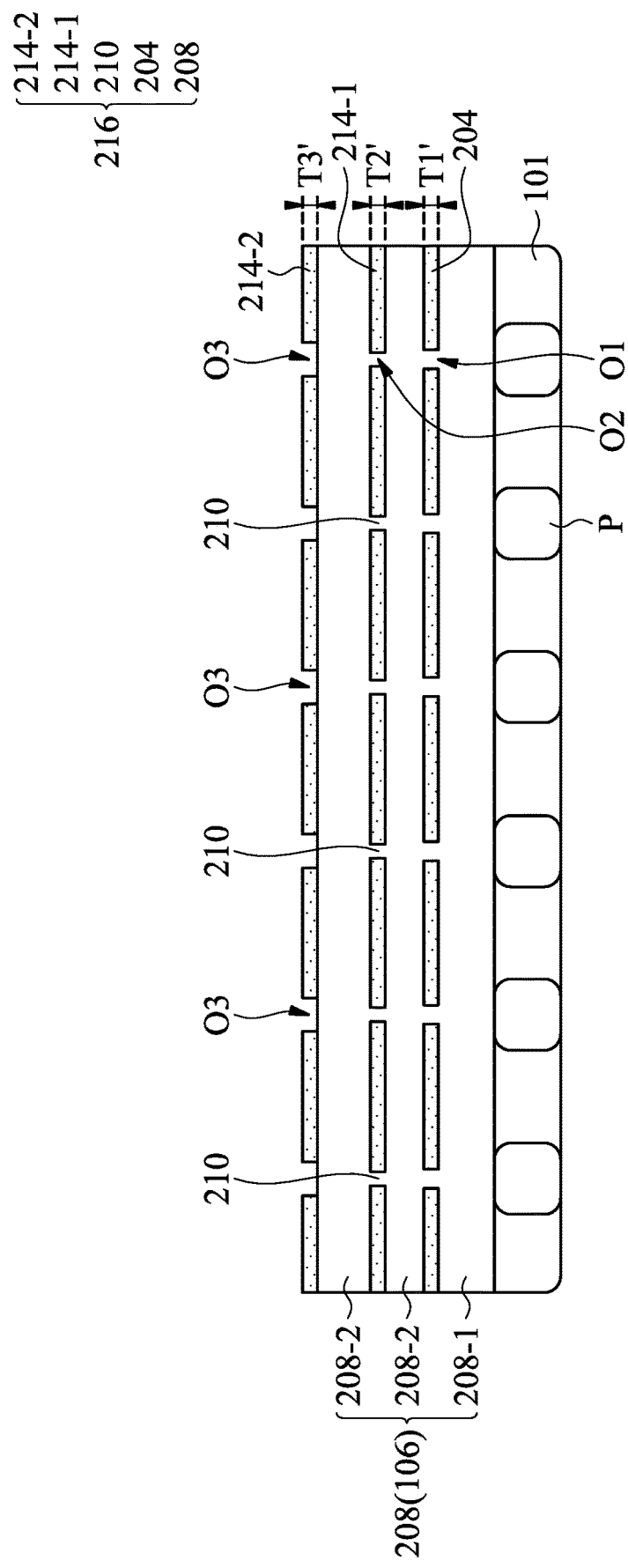

Next, in some embodiments, the light-shielding material 202 is disposed on the transparent material 106 again a patterning process may be performed to pattern the light-shielding material 202 and form a third light-shielding layer 214-2 as shown in FIG. 3F. In more detail, some portions of the light-shielding material 202 may be removed in the pattering process to form the third light-shielding layer 214-2 having a plurality of holes O3 corresponding to the pixels P. Similarly, the patterning process may include soft baking, mask aligning, exposure, post-exposure baking, developing, rinsing, drying, any other applicable process, or a combination thereof.

In some embodiments, the transparent material 106 may optionally fill the holes O3 of the third light-shielding layer 214-2 to planarize the top surface of the third light-shielding layer 214-2, but the present disclosure is not limited thereto.

In some embodiments, a transparent material layer 208 formed of the transparent material 106 may include a raised portion 208-1 and separating portions 208-2. As shown in FIG. 3F, the raised portion 208-1 may be disposed between the substrate 101 and the first light-shielding layer 204, and the separating portions may be disposed between the first light-shielding layer 204 and the second light-shielding layer 214-1 and between the second light-shielding layer 214-1 and the third light-shielding layer 214-2.

In this embodiment, the transparent material filled in the holes O1 of the first light-shielding layer 204, the transparent material filled in the holes O2 of the second light-shielding layer 214-1, the transparent material filled in the holes O3 of the third light-shielding layer 214-2 optionally may be regarded as transparent pillars 210 of the semiconductor device 100' as shown in FIG. 3F. That is, the transparent pillars 210 may be disposed in the first light-shielding layer 204, the second light-shielding layer 214-1, and the third light-shielding layer 214-2. Similarly, the top surface of each of the transparent pillars 210 may be round, but the present disclosure is not limited thereto. In other embodiments, the top surface of each of the transparent pillars 210 may be oval, oblong, rectangular, hexagonal, irregular-shaped, any other applicable shape, or a combination thereof.

In some embodiments, the transparent pillars 210, the first light-shielding layer 204, the second light-shielding layer 214-1, the third light-shielding layer 214-2 and the transparent material layer 208 may serve as the light-collimating layer 216 of the semiconductor device 100' as shown in FIG. 3F.

In some embodiments, the cross-sectional area of each hole O2 of the second light-shielding layer 214-1 may be different from the cross-sectional area of each hole O3 of the third light-shielding layer O3. For example, in the embodiment as shown in FIG. 3F, the cross-sectional area of each hole O2 of the second light-shielding layer 214-1 is smaller than the cross-sectional area of each hole O3 of the third light-shielding layer O3; the cross-sectional area of each hole O1 of the first light-shielding layer 204 is larger than the cross-sectional area of each hole O2 of the second light-shielding layer 214-1, but smaller than the cross-sectional area of each hole O3 of the third light-shielding layer 214-2. But the present disclosure is not limited thereto. In other embodiments, the cross-sectional area of each hole O1 of the first light-shielding layer 204 may be equal to the cross-sectional area of each hole O3 of the third light-shielding layer O3.

The size of the hole O1 of the first light-shielding layer 204, the size of the hole O2 of the second light-shielding layer 214-1 and the size of the hole O3 of the third light-shielding layer 214-2 may be adjusted in accordance with the paths of the lights to avoid the lights in the semiconductor device 100' from crosstalk. Moreover, the transparent material layer 208 may be correspondingly disposed, such that each of the transparent pillars 210 of the light-collimating layer 216 may have a smaller aspect ratio. This may avoid or reduce the collapse of the transparent pillars 210 and maintain great collimation performance of the light-collimating layer 216 at the same time.

In some embodiments, the thickness T2' of the second light-shielding layer 214-1 may be different from the thickness T3' of the third light-shielding layer 214-2, but the present disclosure is not limited thereto. In other embodiments, the thickness T1' of the first light-shielding layer 204, the thickness T2' of the second light-shielding layer 214-1, and the thickness T3' of the third light-shielding layer 214-2 may be the same. the thickness T1' of the first light-shielding layer 204, the thickness T2' of the second light-shielding layer 214-1, and the thickness T3' of the third light-shielding layer 214-2 may be changed in accordance with the actual demand. Moreover, the distance between the first light-shielding layer 204 and the second light-shielding layer 214-1 and the distance between the second light-shielding layer 214-1 and the third light-shielding layer 214-2 may be different from each other, which may be adjusted in accordance with the paths of the lights.

It should be noted that the semiconductor device 100' may not include the third light-shielding layer 214-2 in some embodiments. Furthermore, the process steps as shown in FIGS. 3C-3D (or FIGS. 3E-3F) may be repeated to form more light-shielding layers. The number of the light-shielding layers is not limited in the present disclosure, and may be changed in accordance with the actual demand.

Figure 4:
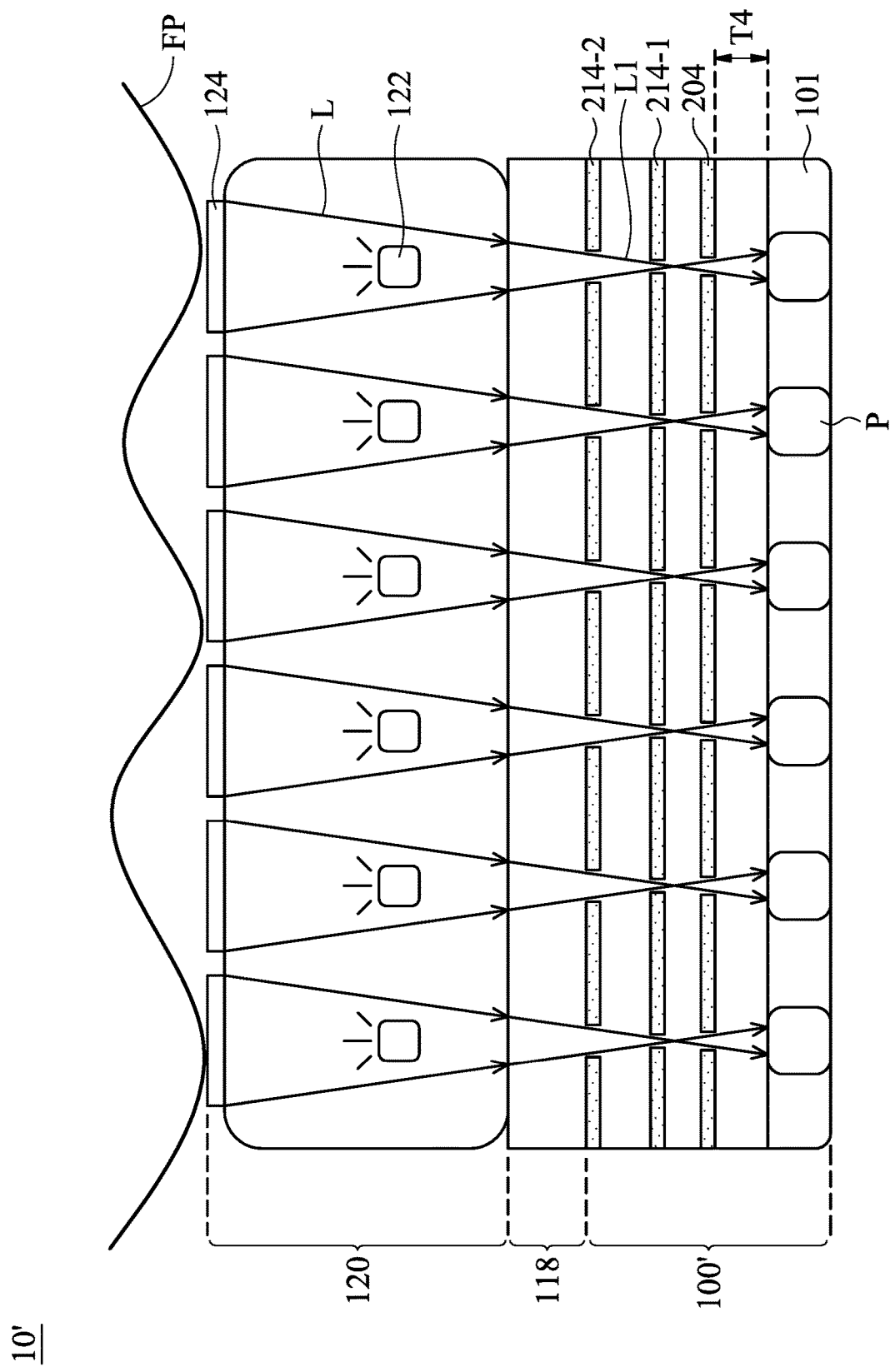
FIG. 4 is a schematic diagram illustrating the application of the semiconductor device of the embodiments according to the present disclosure to a biometric device.

FIG. 4 is a schematic diagram illustrating the application of the semiconductor device 100' of the embodiments according to the present disclosure to a biometric device 10'. Here, the biometric device 10' may be a fingerprint identification device, for example.

In some embodiments, the biometric device 10' may include the semiconductor device 100', a color filter layer 118 and a light source layer 120 as shown in FIG. 4. The semiconductor device 100' may be formed according to the steps shown in FIGS. 3A-3F. Next, the color filter layer 118 may be disposed on the semiconductor device 100'. The color filter layer 118 may be made of a polymer material or another suitable material. The color filter layer 118 is configured to limit the passage of light, such that the light with a specific wavelength may pass through the color filter layer 118, and the light with other wavelengths may be isolated.

Next, the light source layer 120 may be disposed on the color filter layer 118. In some embodiments, light source layer 120 may include a plurality of light sources (e.g., light emitting diode, LED) 122. The light sources 122 may be arranged in an array, for example. Moreover, the light source layer 120 may further include a barrier layer, other suitable optical components, or a combination thereof (not shown). A cover plate (e.g., glass cover plate) 124 may be disposed on the top of the light source layer 120 to form a biometric device (e.g., fingerprint identification device). It should be noted that the light source layer 120 may include other elements which is not shown in FIG. 4. The present disclosure is not limited thereto.

For example, the lights emitting from the light sources 122 may be blocked by the biometric characteristics (e.g., fingerprints FP) from outside, and then different reflected lights L are generated and enter the color filter layer 118. The color filter layer 118 may limit the reflected lights L, such that the light L1 with the specific wavelength corresponding to the pixels P (e.g., including or corresponding to at least one photoelectric diode (PD) and/or other suitable components) may pass through the color filter layer 118, and the light with other wavelengths may be isolated. The light L1 passing through the color filter layer 118 then sequentially enter the transparent pillars 210 inside the first light-shielding layer 204, the second light-shielding layer 214-1 and the third light-shielding layer 214-2. Since the first light-shielding layer 204, the second light-shielding layer 214-1 and the third light-shielding layer 214-2 may be black (e.g., formed of black photoresist, black ink, black molding compound or black solder mask) and the size of the hole O1 of the first light-shielding layer 204, the size of the hole O2 of the second light-shielding layer 214-1 and the size of the hole O3 of the third light-shielding layer 214-2 (or the width of the transparent pillar 210) may be adjusted in accordance with the path of the light, it may avoid the lights L1 from crosstalk and enhance the collimation performance of the light-collimating layer 216.

Moreover, it may be known from the path of the lights L (of lights L1) that since the size of each hole (e.g., hole O1, hole O2 and hole O3) of the plurality of light-shielding layers (e.g., the first light-shielding layer 204, the second light-shielding layer 214-1 and the third light-shielding layer 214-2) may be adjusted in accordance with the path of the lights, it may effectively limit the positions of the lights to avoid the lights from crosstalk. Moreover, the transparent material layer 208 may be correspondingly disposed, such that each of the transparent pillars 210 of the light-collimating layer 216 may have a smaller aspect ratio. This may avoid or reduce the collapse of the transparent pillars 210 and maintain great collimation performance of the light-collimating layer 216 at the same time (i.e., the resolution of the pixels P may be more improved).

Figure 5:
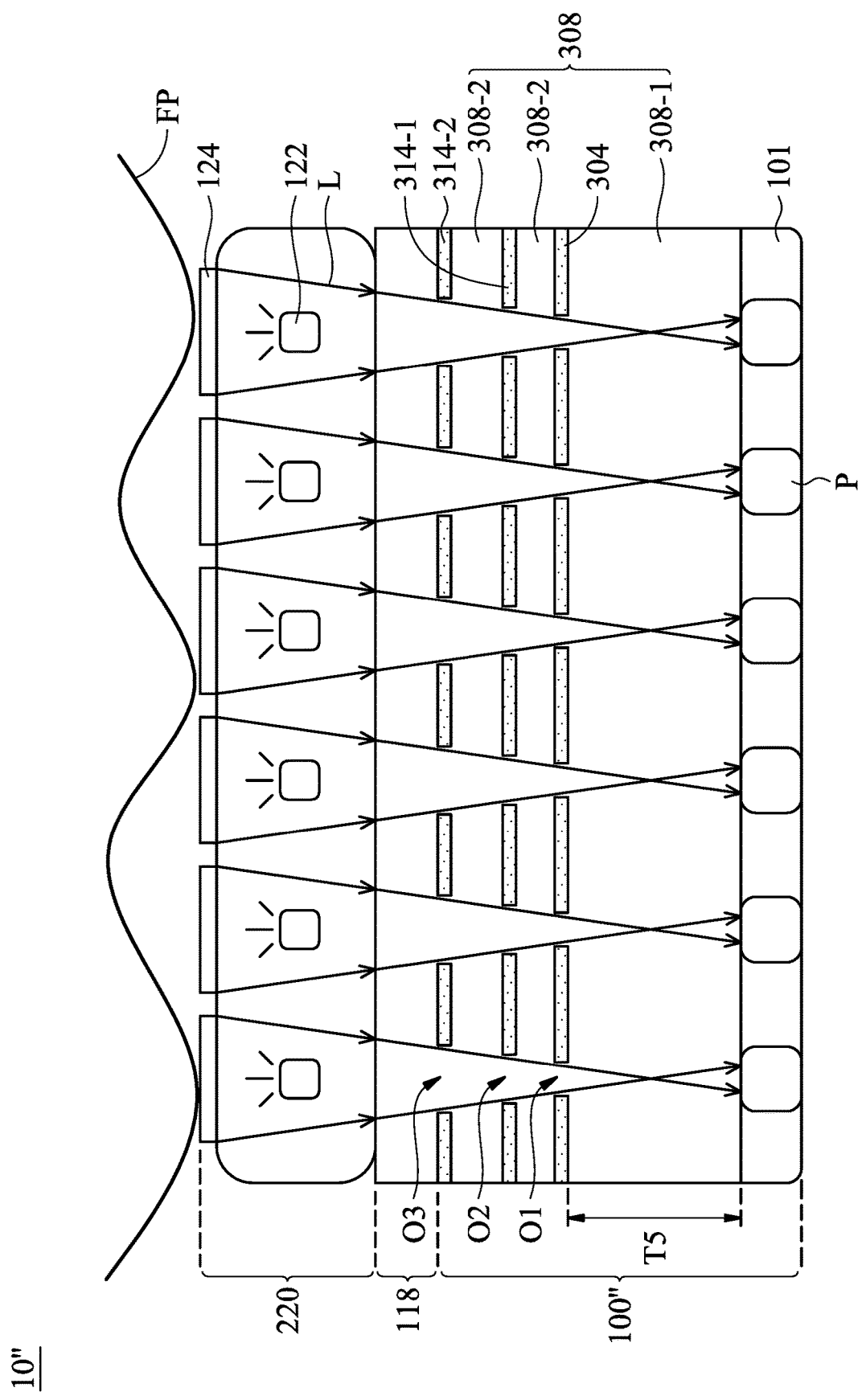
FIG. 5 is a schematic diagram illustrating the application of the semiconductor device of the embodiments according to the present disclosure to a biometric device.

FIG. 5 is a schematic diagram illustrating the application of the semiconductor device 100" of the embodiments according to the present disclosure to a biometric device 10". Here, the biometric device 10" may be a fingerprint identification device, for example.

In some embodiments, the biometric device 10" may include the semiconductor device 100", a color filter layer 118 and a light source layer 220 as shown in FIG. 5. Some differences between the semiconductor device 100" as shown in FIG. 5 and the semiconductor device 100' as shown in FIG. 4 (or FIG. 3F) include the thickness of the raised portion 308-1 of the transparent material layer 308, the size of the hole O1 of the first light-shielding layer 304, the size of the hole O2 of the second light-shielding layer 314-1 and the size of the hole O3 of the third light-shielding layer 314-2. Other same or similar features will not be mentioned repeatedly.

The thickness T5 of the raised portion 308-1 of the transparent material layer 308 as shown in FIG. 5 is larger than the thickness T4 of the raised portion 208-1 of the transparent material layer 208 as shown in FIG. 4 (or FIG. 3F). Therefore, the size of the hole O1 of the first light-shielding layer 304, the size of the hole O2 of the second light-shielding layer 314-1 and the size of the hole O3 of the third light-shielding layer 314-2, which may be adjusted in accordance with the paths of the lights as shown in FIG. 5, may be different from the size of the hole O1 of the first light-shielding layer 204, the size of the hole O2 of the second light-shielding layer 214-1 and the size of the hole O3 of the third light-shielding layer 214-2 as shown in FIG. 4 (or FIG. 3F).

For example, the cross-sectional area of each hole O3 of the third light-shielding layer 314-2 may be larger than the cross-sectional area of each hole O2 of the second light-shielding layer 314-1, and the cross-sectional area of each hole O2 of the second light-shielding layer 314-1 may be larger than the cross-sectional area of each hole O1 of the first light-shielding layer 304. Moreover, the separating portions 308-2 of the transparent material layer 308 as shown in FIG. 5 may be different from the separating portions 208-2 of the transparent material layer 208 as shown in FIG. 4 (or FIG. 3F). In some embodiments, the thickness of the light source layer 220 may be reduced because the raised portion 308-1 of the transparent material layer 308 becomes thicker.

In summary, the light-collimating layer of the semiconductor device in the embodiments according to the present disclosure includes a plurality of light-shielding layers with holes having different cross-sectional areas. Since the light-shielding layers may be disposed in the light-collimating layer and the transparent material layer may be disposed correspondingly, each of the transparent pillars of the light-collimating layer may have a smaller aspect ratio. This may avoid or reduce the collapse of the transparent pillars and maintain great collimation performance of the light-collimating layer at the same time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, each claim may be an individual embodiment of the present disclosure, and the scope of the present disclosure includes the combinations of every claim and every embodiment of the present disclosure.

In addition, although some embodiments of the present disclosure are disclosed above, they are not intended to limit the scope of the present disclosure. Furthermore, not all advantages of the embodiments of the present disclosure are discussed. In addition, those skilled in the art may make various changes, substitutions, and alterations herein without departing from the spirit and scope of the embodiments of the present disclosure. Therefore, the scope of protection should be determined by the claims.

What is claimed is:

1. A semiconductor device, comprising:
   a substrate having a plurality of pixels; and
   a light-collimating layer disposed on the substrate, comprising:
      a transparent material layer covering the pixels;
      a first light-shielding layer disposed on the substrate;
      a second light-shielding layer disposed on the first light-shielding layer;
      a third light-shielding layer disposed on the second light-shielding layer; and
      a plurality of transparent pillars disposed in the first light-shielding layer and the second light-shielding layer,
   wherein the transparent material layer comprises:
   a raised portion disposed between the substrate and the first light-shielding layer; and
   a plurality of separating portions disposed between the first light-shielding layer and the second light-shielding layer and disposed between the second light-shielding layer and the third light-shielding layer,
   wherein a thickness of the second light-shielding layer is different from a thickness of the third light-shielding layer.

2. The semiconductor device as claimed in claim 1, wherein the raised portion is in direct contact with the pixels.

3. The semiconductor device as claimed in claim 1, wherein the first light-shielding layer is disposed between the substrate and the second light-shielding layer.

4. The semiconductor device as claimed in claim 1, wherein the raised portion fully or partially covers the pixels.

5. The semiconductor device as claimed in claim 1, wherein the first light-shielding layer and the second light-shielding layer are formed of the same material.

6. The semiconductor device as claimed in claim 5, wherein the material of the first light-shielding layer and the second light-shielding layer comprises a photoresist, an ink, a molding compound, a solder mask, an epoxy resin or a combination thereof.

7. The semiconductor device as claimed in claim 1, wherein the first light-shielding layer, the second light-shielding layer, and the third light-shielding layer respectively have a plurality of holes, and the transparent pillars are at least disposed in the holes of the first light-shielding layer and the second light-shielding layer.

8. The semiconductor device as claimed in claim 7, wherein a cross-sectional area of each hole of the first light-shielding layer is larger than a cross-sectional area of each hole of the second light-shielding layer, but smaller than a cross-sectional area of each hole of the third light-shielding layer.

9. The semiconductor device as claimed in claim 7, wherein a cross-sectional area of each hole of the first light-shielding layer is equal to a cross-sectional area of each hole of the third light-shielding layer.

10. The semiconductor device as claimed in claim 1, wherein a distance between the first light-shielding layer and the second light-shielding layer is different from a distance between the second light-shielding layer and the third light-shielding layer.

11. The semiconductor device as claimed in claim 1, wherein a thickness of the raised portion is larger than a thickness of the separating portion.

12. The semiconductor device as claimed in claim 1, wherein a top surface of each of the transparent pillars is round, oval, oblong, rectangular, hexagonal, irregular-shaped, or a combination thereof.

13. A biometric device, comprising:
    the semiconductor device as claimed in claim 1;
    a color filter layer disposed on the semiconductor device; and
    a light source layer disposed on the color filter layer.

14. The biometric device as claimed in claim 13, wherein the light source layer comprises a plurality of light sources, and the light sources are arranged in an array.

15. The biometric device as claimed in claim 13, further comprising:
    a cover plate disposed on a top of the light source layer.

* * * * *